(12) United States Patent
Choi et al.

(10) Patent No.: US 10,942,599 B2
(45) Date of Patent: Mar. 9, 2021

(54) ELECTRODE CONNECTION AND ELECTRIC DEVICE COMPRISING THE SAME

(71) Applicant: DONGWOO FINE-CHEM CO., LTD., Jeollabuk-do (KR)

(72) Inventors: Byung Jin Choi, Gyeonggi-do (KR); Dong Hwan Kim, Seoul (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 0 days.

(21) Appl. No.: 15/894,371

(22) Filed: Feb. 12, 2018

(65) Prior Publication Data

US 2018/0164913 A1 Jun. 14, 2018

Related U.S. Application Data

(63) Continuation of application No. PCT/KR2016/008275, filed on Jul. 28, 2016.

(30) Foreign Application Priority Data

| | | |
|---|---|---|
| Aug. 10, 2015 | (KR) | 10-2015-0112508 |
| Aug. 17, 2015 | (KR) | 10-2015-0115270 |
| Mar. 9, 2016 | (KR) | 10-2016-0028157 |

(51) Int. Cl.
*G06F 3/041* (2006.01)
*H05K 1/11* (2006.01)
(Continued)

(52) U.S. Cl.
CPC .......... *G06F 3/04164* (2019.05); *G06F 3/041* (2013.01); *H05K 1/111* (2013.01);
(Continued)

(58) Field of Classification Search
CPC ............ G06F 2203/04103; H05K 2201/09609
See application file for complete search history.

(56) References Cited

U.S. PATENT DOCUMENTS

| | | | |
|---|---|---|---|
| 6,518,557 B1 * | 2/2003 | Izumi | ............... H01L 27/14603 250/208.1 |
| 2003/0164919 A1 * | 9/2003 | Oh | ...................... G02F 1/13452 349/149 |

(Continued)

FOREIGN PATENT DOCUMENTS

| | | |
|---|---|---|
| CN | 104123023 A | 10/2014 |
| JP | 2013-045246 A | 3/2013 |

(Continued)

OTHER PUBLICATIONS

Notice of Allowance dated Dec. 19, 2017 from Korean Patent Office in a counterpart Korean Patent Application No. 10-2016-0028157 (all the cited references are listed in this IDS.) (English translation is also submitted herewith.).

(Continued)

*Primary Examiner* — Priyank J Shah
(74) *Attorney, Agent, or Firm* — The PL Law Group, PLLC

(57) ABSTRACT

An electrode connection unit is to be electrically connected with electrode terminals. The electrode connection unit includes a metallic core part having a plurality of first holes therein and a conductive nonmetallic coating layer on the metallic core part. An image display device and a touch screen panel include the electrode connection unit.

16 Claims, 21 Drawing Sheets

(51) Int. Cl.
*H05K 1/02* (2006.01)
*G02F 1/1333* (2006.01)
*G02F 1/13* (2006.01)

(52) U.S. Cl.
CPC ........ *G02F 1/1303* (2013.01); *G02F 1/13338* (2013.01); *G02F 2201/503* (2013.01); *G06F 2203/04102* (2013.01); *G06F 2203/04103* (2013.01); *H05K 1/0271* (2013.01); *H05K 1/115* (2013.01); *H05K 2201/09609* (2013.01); *H05K 2201/10128* (2013.01); *H05K 2201/10151* (2013.01)

(56) References Cited

U.S. PATENT DOCUMENTS

| | | | | |
|---|---|---|---|---|
| 2005/0072597 | A1* | 4/2005 | Lee | G02F 1/13452 174/262 |
| 2007/0090402 | A1* | 4/2007 | Su | H01L 257/209 |
| 2011/0205716 | A1* | 8/2011 | Moriwaki | H05K 1/025 361/748 |
| 2012/0097432 | A1* | 4/2012 | Huang | H05K 1/117 174/254 |
| 2016/0170537 | A1* | 6/2016 | Chen | G06F 3/044 345/173 |
| 2016/0250875 | A1* | 9/2016 | Tarnowski | H05K 3/1275 345/173 |
| 2017/0068382 | A1* | 3/2017 | Choi | G06F 3/041 |

FOREIGN PATENT DOCUMENTS

| | | |
|---|---|---|
| JP | 2013-156773 A | 8/2013 |
| JP | 2015-011493 A | 1/2015 |
| KR | 10-2012-0067795 A | 6/2012 |
| KR | 10-2012-0076065 A | 7/2012 |
| KR | 10-2014-0056428 A | 5/2014 |
| KR | 10-2015-0060049 A | 6/2015 |
| TW | 201218331 A | 5/2012 |
| TW | 201445226 A | 12/2014 |

OTHER PUBLICATIONS

Notice of Allowance dated Dec. 1, 2017 from Korean Patent Office in a counterpart Korean Patent Application No. 10-2015-0115270 (all the cited references are listed in this IDS.) (English translation is also submitted herewith.).
International Search Report for PCT/KR2016/008275.

* cited by examiner

| Section | 6.4 kgf Condition | 10 kgf Condition |
|---|---|---|
| Comparative Example 3 |  |  |
| Comparative Example 4 |  | — |
| Example 10 |  |  |
| Example 11 |  |  |
| Example 12 |  |  | ns
ELECTRODE CONNECTION AND ELECTRIC DEVICE COMPRISING THE SAME

CROSS REFERENCE TO RELATED APPLICATIONS AND CLAIM OF PRIORITY

The present application is a continuation application to International Application No. PCT/KR2016/008275 with an International Filing Date of Jul. 28, 2016, which claims the benefit of Korean Patent Application Nos. 10-2015-0112508 filed on Aug. 10, 2015 and 10-2015-0115270 filed on Aug. 17, 2015 and 10-2016-0028157 filed on Mar. 9, 2016 at the Korean Intellectual Property Office, the disclosures of which are incorporated by reference herein in their entirety.

BACKGROUND

1. Field of the Invention

The present invention relates to an electrode connection unit and an electric device including the same.

2. Description of the Related Art

A touch screen panel uses a plurality of driving electrodes and a plurality of receiving electrodes for sensing a touch, and is provided with a pad part at an electrode terminal to electrically connect these electrodes with a flexible printed circuit board (FPCB).

In the past, a cathode ray tube (CRT) monitor makes up the largest part of an image display device, however, due to a rapid growth of techniques in recent years, flat panel displays (FPDs) such as a liquid crystal display (LCD), field emission display (FED), plasma display panel (PDP), organic light emitting diode (OLED), and the like have been developed.

A flat display panel may be classified into a display part to display an image and a non-display part surrounding the display part. The display part includes pixels defined by gate lines and data lines intersecting each other, and the non-display part includes a data pad and a gate pad formed at ends of the gate lines and the data lines to transmit and receive an electrical signal with a driving device. The driving device includes a chip or a substrate for driving the flat display panel, for example, a driving integrated circuit (D-IC), the FPCB, and the like.

A method of mounting the D-IC on the flat display panel includes a chip on glass (COG) method, a tape carrier package (TCP) method, a chip on film (COF) method, or the like.

In order to mount components by the COG or COF method, the flat display panel needs the pad part for contacting the components with the D-IC or the FPCB to be electrically connected with each other.

However, in order to electrically connect the pad part, which is connected with the electrodes of the touch screen panel or the image display device, with the D-IC or FPCB, a process of contacting by an anisotropic conductive film (ACF) is required, and when a lower substrate of the pad part is made of a soft material, cracks may occur in the pad part during the process.

SUMMARY

Accordingly, it is an aspect of the present invention to provide an electrode connection unit which may prevent an occurrence or diffusion of cracks to reduce a damage in a manufacturing process.

In addition, another aspect of the present invention is to provide an image display device and a touch screen panel, which include the electrode connection unit.

One or more of the above aspects of the present invention will be achieved by one or more of the following characteristics:

(1) An electrode connection unit configured to be electrically connected with electrode terminals, including: a metallic core part including a plurality of first holes therein; and a conductive nonmetallic coating layer.

(2) The electrode connection unit according to the above (1), wherein the plurality of first holes are arranged on straight lines connecting between one end and the other end of the electrode connection unit.

(3) The electrode connection unit according to the above (2), wherein the plurality of first holes are regularly or irregularly arranged so that any straight line connecting between one end and the other end of the electrode connection unit meets with at least one the first hole.

(4) The electrode connection unit according to the above (1), wherein a total area of the plurality of first holes is 1 to 90%, based on a region of a portion connected with other conductive members on the electrode connection unit based on the region.

(5) The electrode connection unit according to the above (1), wherein a total area of the plurality of first holes is 5 to 35%, based on a region of a portion connected with other conductive members on the electrode connection unit based on the region.

(6) The electrode connection unit according to the above (1), wherein the metallic core part is formed in a plurality of layers.

(7) The electrode connection unit according to the above (1), wherein the conductive nonmetallic coating layer is arranged on an upper side or lower side of the metallic core part.

(8) The electrode connection unit according to the above (1), wherein the conductive nonmetallic coating layers are arranged on upper and lower sides of the metallic core part.

(9) The electrode connection unit according to the above (1), further including an insulation layer which covers at least a portion of the metallic core part.

(10) The electrode connection unit according to the above (9), wherein the insulation layer has a second hole formed therein.

(11) The electrode connection unit according to the above (10), wherein a plurality of second holes are formed in the insulation layer.

(12) The electrode connection unit according to the above (1), further including an insulation layer which covers at least a portion of the conductive nonmetallic coating layer.

(13) The electrode connection unit according to the above (12), wherein the insulation layer has a second hole formed therein.

(14) The electrode connection unit according to the above (13), wherein a plurality of second holes are formed in the insulation layer.

(15) An electric device including the electrode connection unit according to any one of the above (1) to (14).

(16) An image display device including the electric device according to the above (15).

(17) A touch screen panel including the electric device according to the above (15).

According to the present invention, a pressure applied to the electrode connection unit may be dispersed, thereby to prevent an occurrence or diffusion of cracks.

In addition, according to the present invention, a flexibility of the electrode connection unit may be increased, thereby to prevent an occurrence or diffusion of cracks.

Further, according to the present invention, due to a prevention of an occurrence or diffusion of cracks, it is possible to reduce a damage in a manufacturing process, while increasing the life-span of products.

Particularly, when applying the electrode connection unit of the present invention to a touch screen panel, since an occurrence or diffusion of cracks in the electrode connection unit may be prevented, it is possible to implement a touch screen panel having rapid response speed and high sensitivity.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION

Figure 1:
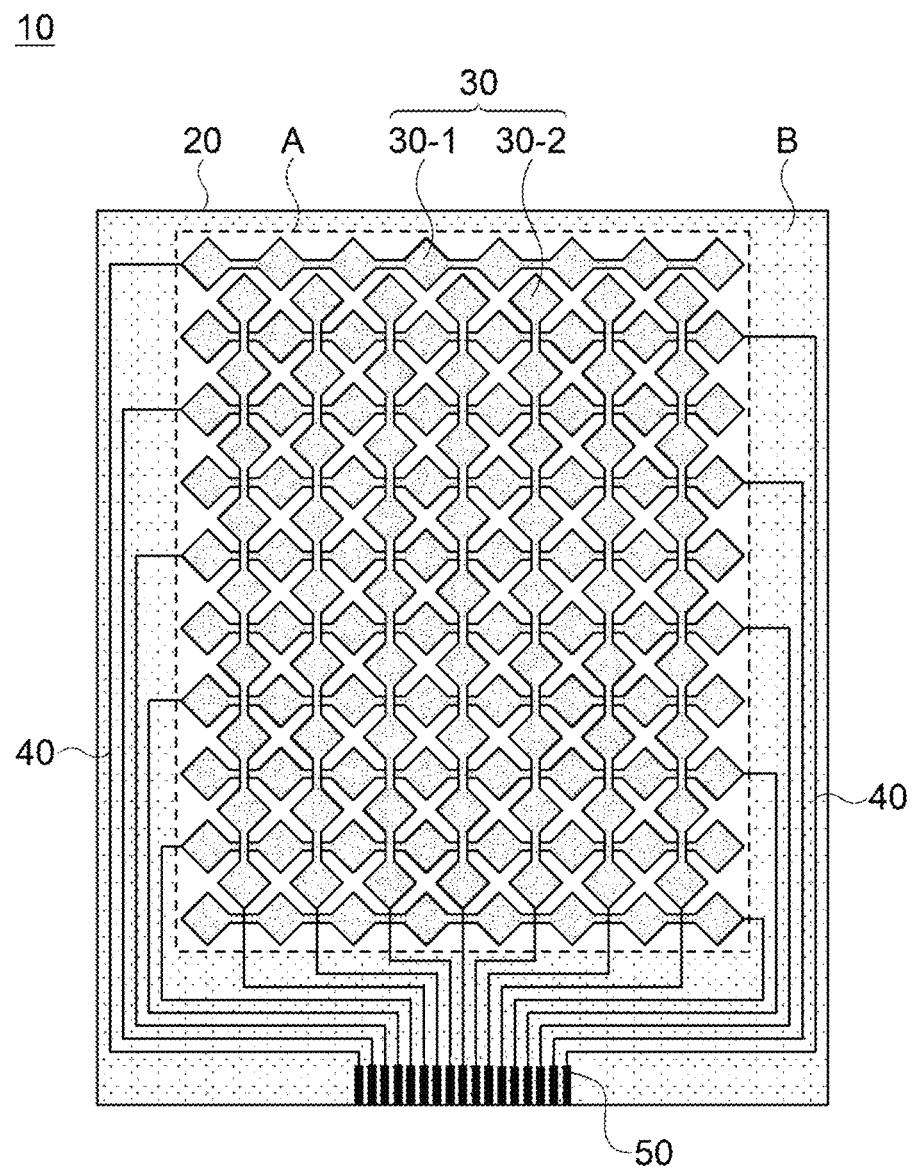
FIG. 1 is a plan view schematically illustrating an example of an electrode structure of a touch screen panel.

The present invention discloses an electrode connection unit which is electrically connected with electrode terminals and has a plurality of first holes formed therein, such that a pressure applied to the electrode connection unit may be diffused, thus to prevent an occurrence or diffusion of cracks and reduce a damage in a manufacturing process, and an image display device and a touch screen panel including the above electrode connection unit.

Hereinafter, exemplary embodiments of the present invention will be described in detail with reference to the accompanying drawings. However, since the drawings attached to the present disclosure are only given for illustrating one of various embodiments of present invention to easily understand the technical spirit of the present invention with the above-described invention, it should not be construed as limited to such a description illustrated in the drawings.

Electrode Connection Unit

The present invention provides an electrode connection unit which is electrically connected with electrode terminals and has a plurality of first holes formed therein.

An electrode according to the invention is not particularly limited so long as it is an electrode used in an electric device, and particular examples thereof may include various electrodes provided in an image display device or touch screen panel.

The electrode connection unit serves to electrically connect the electrodes with other conductive members. The above other conductive members may be determined in various ways depending on types of the electrodes. For example, the above other conductive members may be a portion which connects with a flexible printed circuit board (FPCB) connected to an external driving circuit of a touch sensing electrode provided on the touch screen panel.

FIG. 1 is a plan view schematically illustrating an example of an electrode structure of the touch screen panel. Hereinafter, embodiments of the present invention will be described based on the touch screen panel, but the present invention is not particularly limited thereto.

Referring to FIG. 1, a touch screen panel 10 includes a display part A and a non-display part B. The display part A and the non-display part B may be formed on a transparent substrate 20. The display part A may be formed at a central portion of the touch screen panel 10, and the non-display part B may be formed at a peripheral portion (that is, on an edge portion) of the touch screen panel 10. The display part A may include sensing electrode patterns 30 formed thereon to sense an electrical or physical change by touch of a user. Herein, the sensing electrode patterns 30 may include first sensing electrode patterns 30-1 and second sensing electrode patterns 30-2. The first sensing electrode patterns 30-1 and the second sensing electrode patterns 30-2 may be regularly formed in a rhombic shape to be adjacent to each other on the transparent substrate 20.

For example, the first sensing electrode patterns 30-1 may be formed on the transparent substrate 20 in a plurality of rows, and the second sensing electrode patterns 30-2 may be formed on the transparent substrate 20 in a plurality of columns.

The non-display part B may include position detecting lines 40 and an electrode connection unit 50 formed thereon. One end of the position detecting lines 40 may be respectively connected to the first sensing electrode patterns 30-1 formed in the plurality of rows and the second sensing electrode patterns 30-2 formed in the plurality of columns, and the other end of the position detecting lines 40 may be connected to the electrode connection unit 50. In addition, the electrode connection unit 50 may be connected with the external driving circuit.

In the present disclosure, the expression of "electrically connecting" means that the electrode connection unit is connected with the electrodes via wirings. The electrode connection unit may be formed over a wider area than the wirings to increase reliability of the electrical connection.

As described above, conventionally, when the lower substrate of the electrode connection unit is formed of a soft material, in the process of contacting the electrode connection unit by an anisotropic conductive film (ACF), the lower substrate may not endure against an adherence pressure (for example, a load of 7 kg) applied thereto during contacting while being bent, thereby resulting in cracks in the electrode connection unit to cause a product failure.

According to the present invention, the electrode connection unit which may be electrically connected with electrode terminals may include a plurality of first holes 60 formed therein, such that the pressure applied to the electrode connection unit may be diffused to prevent an occurrence of cracks in the electrode connection unit, or a diffusion of the cracks occurred in advance.

FIGS. 2 to 8 are schematic plan views illustrating electrode connection units according to one embodiment of the present invention, respectively.

According to one embodiment of the present invention, the plurality of first holes 60 may have a circular or polygonal shape, but it is not particularly limited thereto. The polygon may include for example, a triangle, quadrangle, hexagon, octagon, decagon, and the quadrangle may include a rectangle, rhombus, or the like.

Figure 2:
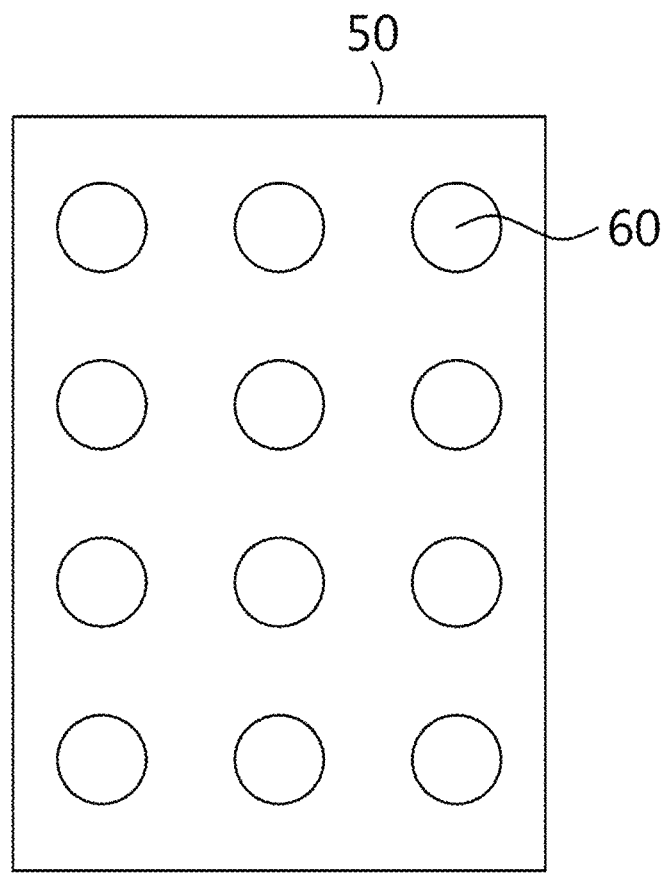
FIGS. 2 to 8 are schematic plan views illustrating electrode connection units according to one embodiment of the present invention, respectively.
Figure 4:
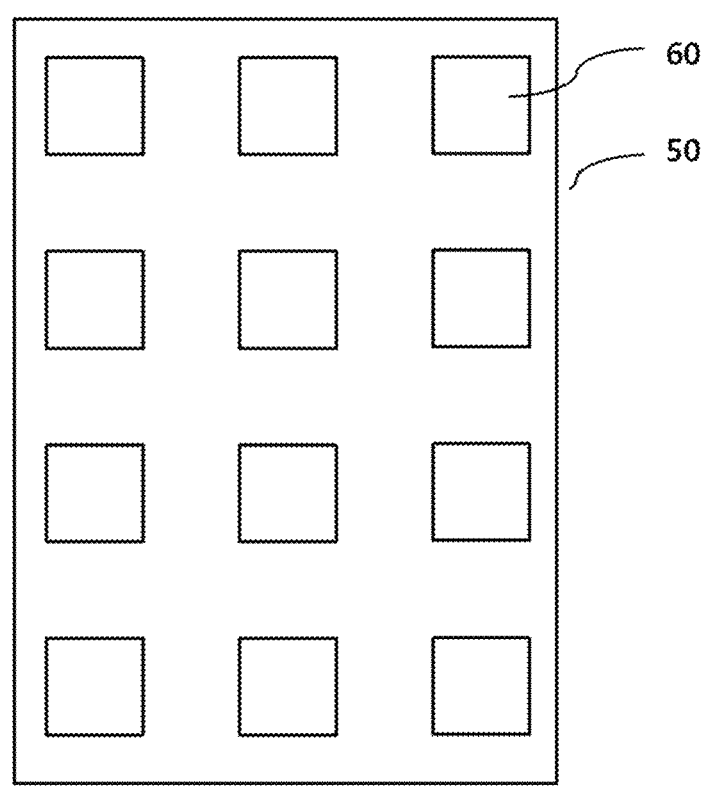
Figure 6:
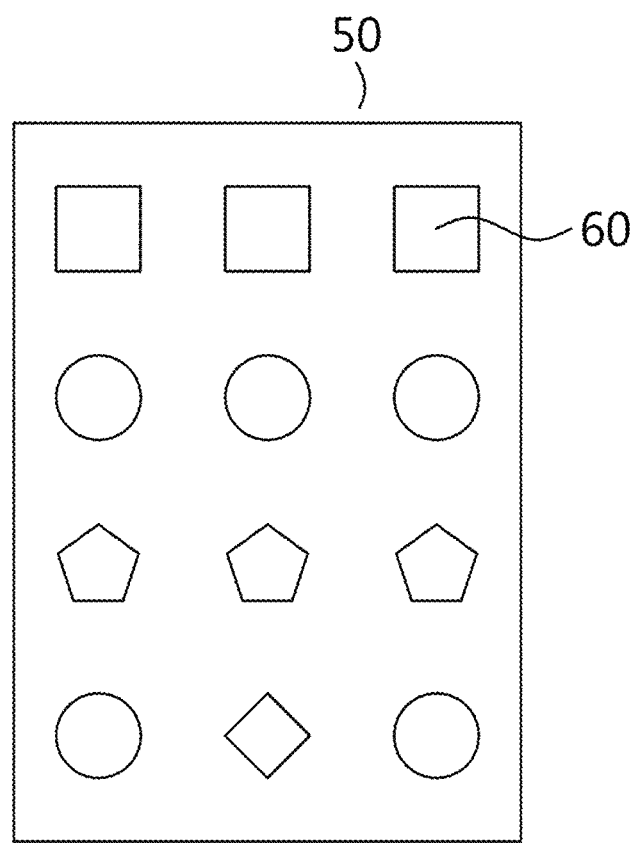

An arrangement type of the plurality of first holes is not particularly limited, and according to one embodiment of the present invention, the plurality of first holes 60 may be arranged on a plurality of straight lines connecting between one end and the other end of the electrode connection unit 50. FIGS. 2, 4 and 6 schematically illustrate forms in which the circular or polygonal plurality of first holes 60 are arranged along any straight line.

According to another embodiment of the present invention, when the plurality of first holes 60 are arranged on a plurality of straight lines connecting between one end and the other end of the electrode connection unit 50, the plurality of first holes 60 may be regularly or irregularly arranged so that any straight line connecting between one end and the other end of the electrode connection unit 50 meets with at least one first hole 60. In this case, even if cracks occur at any position, a probability in which the straight line meets with the first hole is increased, so that effects of preventing diffusion of cracks may be remarkably increased.

Figure 3:
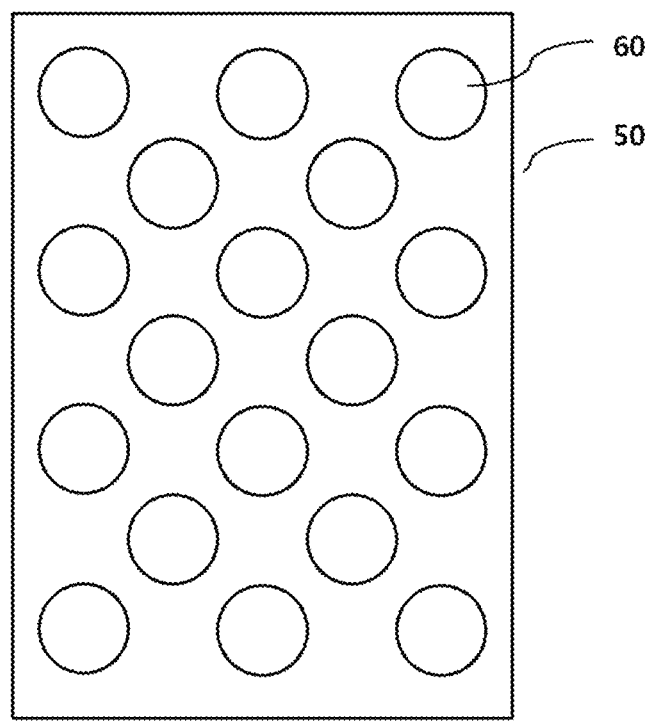
Figure 5:
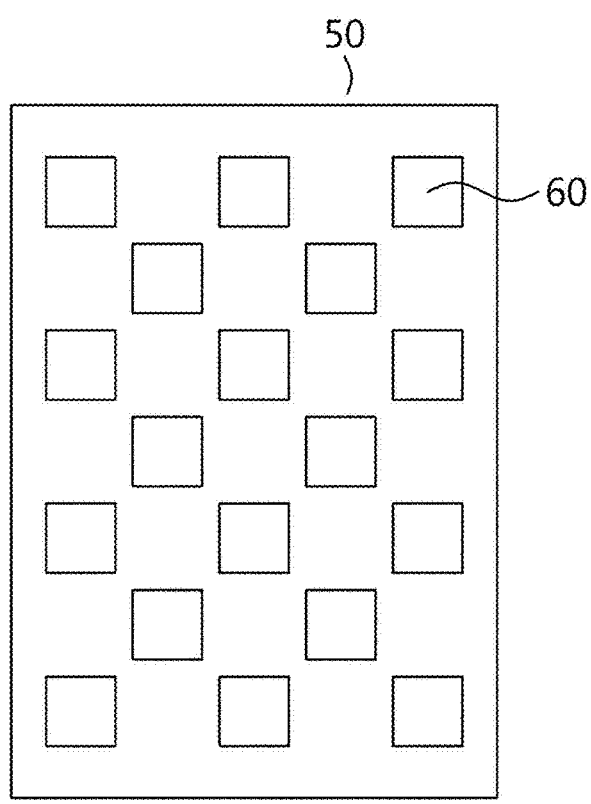
Figure 7:
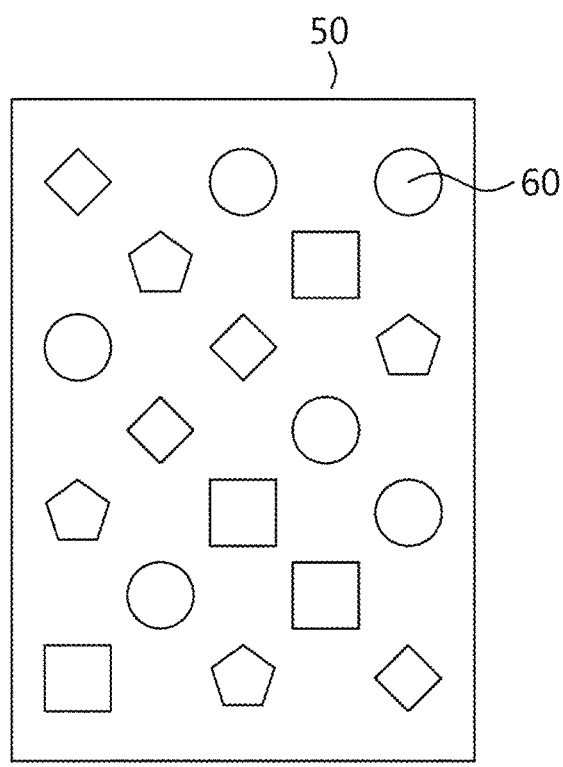

FIGS. 3, 5 and 7 illustrate examples in which the plurality of first holes 60 are regularly arranged so that any straight line connecting between one end and the other end of the electrode connection unit 50 meets with at least one first hole 60. As illustrated in FIGS. 3, 5 and 7, the plurality of first holes 60 may be arranged alternately with each other to more effectively prevent the diffusion of cracks.

Figure 8:
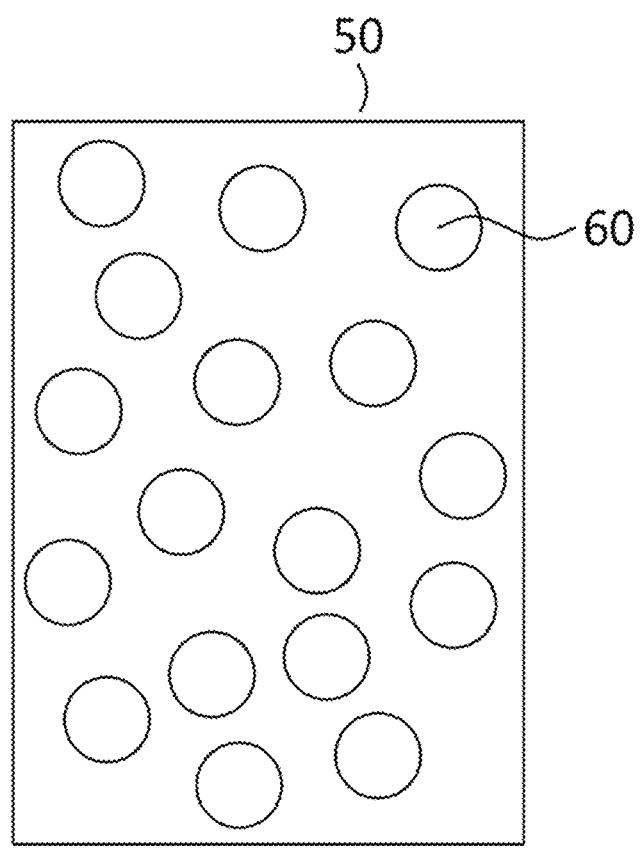

FIG. 8 schematically illustrates an example in which the plurality of first holes 60 are irregularly arranged so that any straight line connecting between one end and the other end of the electrode connection unit 50 meets with at least one first hole 60.

In the present invention, sizes of the plurality of first holes 60 may be suitably selected. For example, a total area of the plurality of first holes 60 may be 1 to 90%, and for example, 5 to 35%, based on a region of a portion to be connected with other conductive members on the electrode connection unit based on the region. When the total area of the plurality of first holes 60 is within a range of 5 to 35%, effects of preventing an occurrence or diffusion of cracks may be maximized without a decrease in reliability of connection and electrical conductivity. More particularly, in a case of a metallic core part, as the number of the first holes is increased, the electrical conductivity may be decreased but an occurrence of cracks may be reduced. Herein, the electrode connection unit of the present invention may include the metallic core part, and a conductive nonmetallic coating layer. When significantly increasing the area of the first holes in the metallic core part, a load thereof may be transmitted to the conductive nonmetallic coating layer, such that cracks may occur in the conductive nonmetallic coating layer. Thereby, when also considering suppression of an occurrence of cracks in the nonmetallic coating layer, it is preferable that the total area of the plurality of the first holes 60 may be within a range of 5 to 35%

The portion to be connected with other conductive members on the electrode connection unit 50 according to the present invention may be a quadrangle whose width direction is a width of the electrode connection unit, and length direction is a length between opposite ends of the above other conductive member, when connecting the above other conductive members on the electrode connection unit, for example.

According to one embodiment of the present invention, the electrode connection unit 50 may include groove parts 70. Thus, the electrode connection unit 50 may have improved flexibility so that effects of preventing an occurrence or diffusion of cracks of the electrode connection unit 50 may be maximized. In this regard, the groove parts 70 may be formed in a direction in which the electrode connection unit 50 is mainly and largely bent during treating the same, or in a direction in which cracks occur or are diffused.

Figure 9:
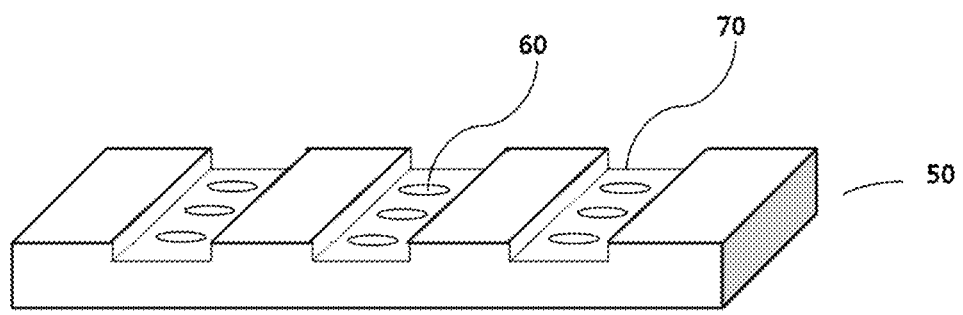
FIG. 9 is a schematic perspective view illustrating an electrode connection unit according to another embodiment of the present invention.

As one embodiment of the present invention, the groove parts 70 may be formed along any straight line connecting between one end and the other end of the electrode connection unit 50, and as another embodiment of the present invention, the groove parts 70 may be formed along the plurality of first holes 60 which are arranged along any straight line of the electrode connection unit 50. FIG. 9 illustrates an example in which the groove parts 70 are formed along the plurality of first holes 60 which are arranged along any straight line of the electrode connection unit 50.

According to one embodiment of the present invention, a method of forming the groove parts 70 in the electrode connection unit 50 is not particularly limited within a range not departing from the purpose of the present invention.

For example, when manufacturing the electrode connection unit by photolithography, the groove parts 70 may be formed using a half-tone mask (HTM). The HTM may implement a selective exposure of photoresist and a difference in a height of patterns by differently adjusting an intensity of light transmitting through different regions, and may form the groove parts 70 according to the above-described principle.

A material of the electrode connection unit 50 may include any material so long as it has excellent electrical conductivity without particular limitation thereof. For example, the electrode connection unit 50 may be formed of a material including at least one of metal, conductive metal oxide, and conductive carbon.

The metal may be, specifically, silver (Ag), gold, aluminum, molybdenum, copper, chromium, neodymium and an alloy thereof, the conductive metal oxide may be, specifically, indium tin oxide (ITO), indium zinc oxide (IZO), Al-doped ZnO (AZO) and transparent conductive oxide (TCO), etc., and the conductive carbon may be, specifically, carbon nanowires, carbon nanotubes (CNT), graphene, etc., but it is not particularly limited thereto. These materials may be used alone or in combination of two or more thereof.

Figure 10:
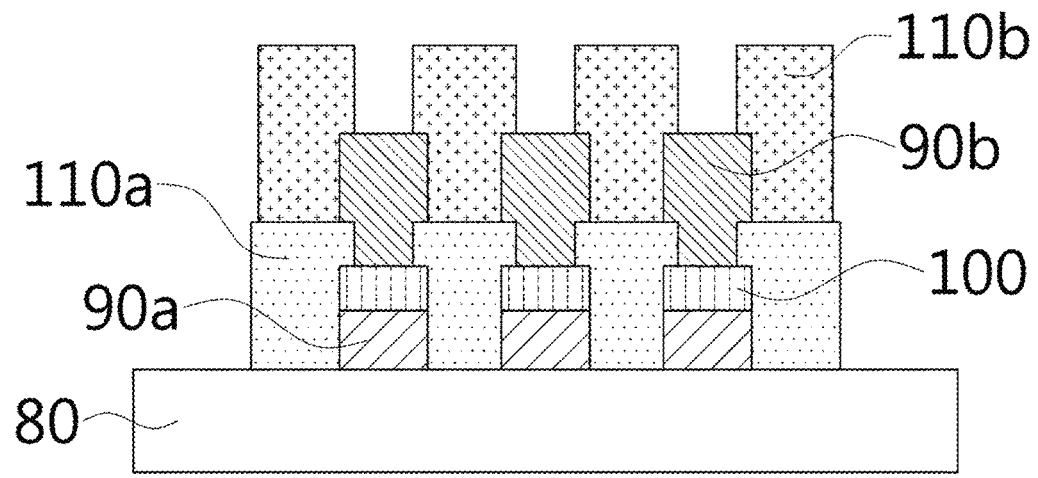
FIG. 10 is a cross-sectional view schematically illustrating a cross section of an electrode connection unit of Examples 1 to 4 according to one embodiment of the present invention.
Figure 11:
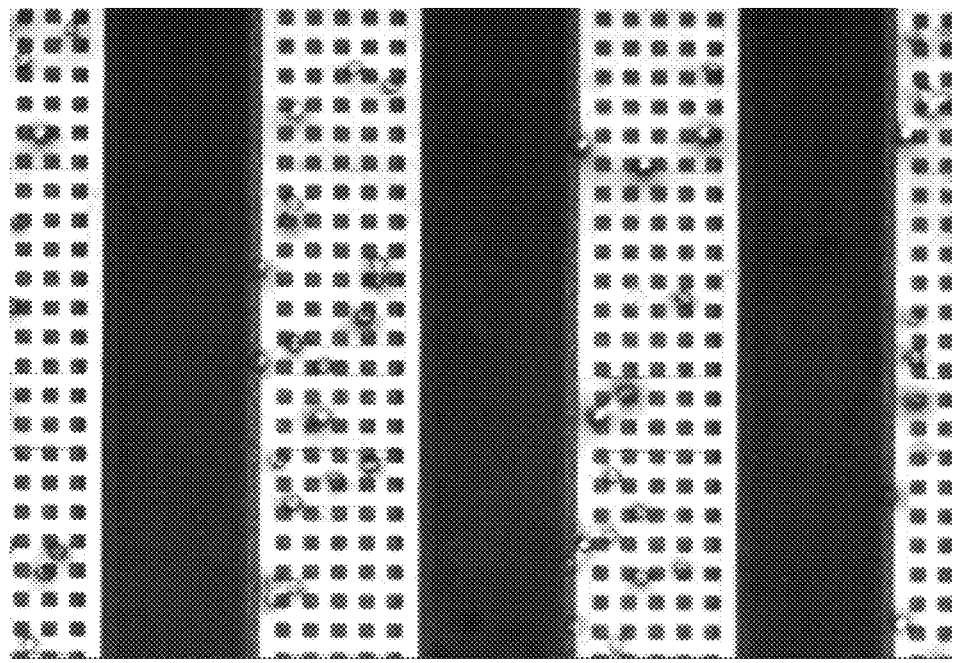
FIGS. 11 to 16 are images illustrating the electrode connection units of Examples 1 to 6 according to one embodiment of the present invention after evaluation for an occurrence of cracks, respectively.
Figure 12:
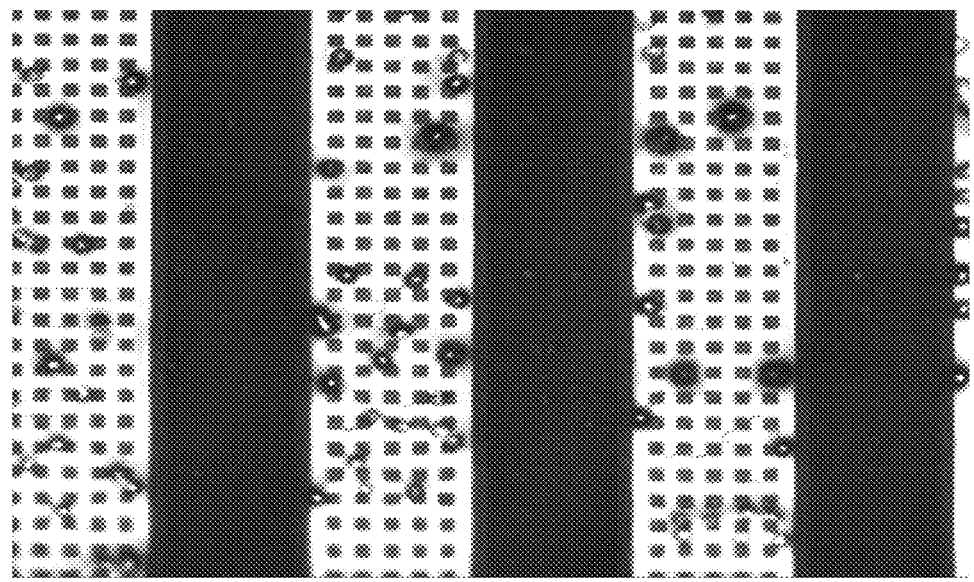
Figure 13:
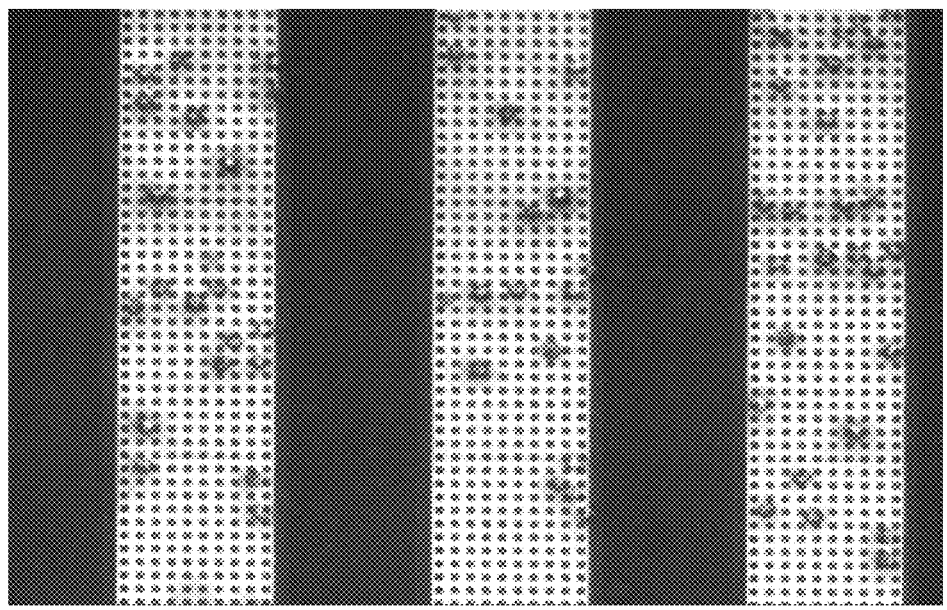
Figure 14:
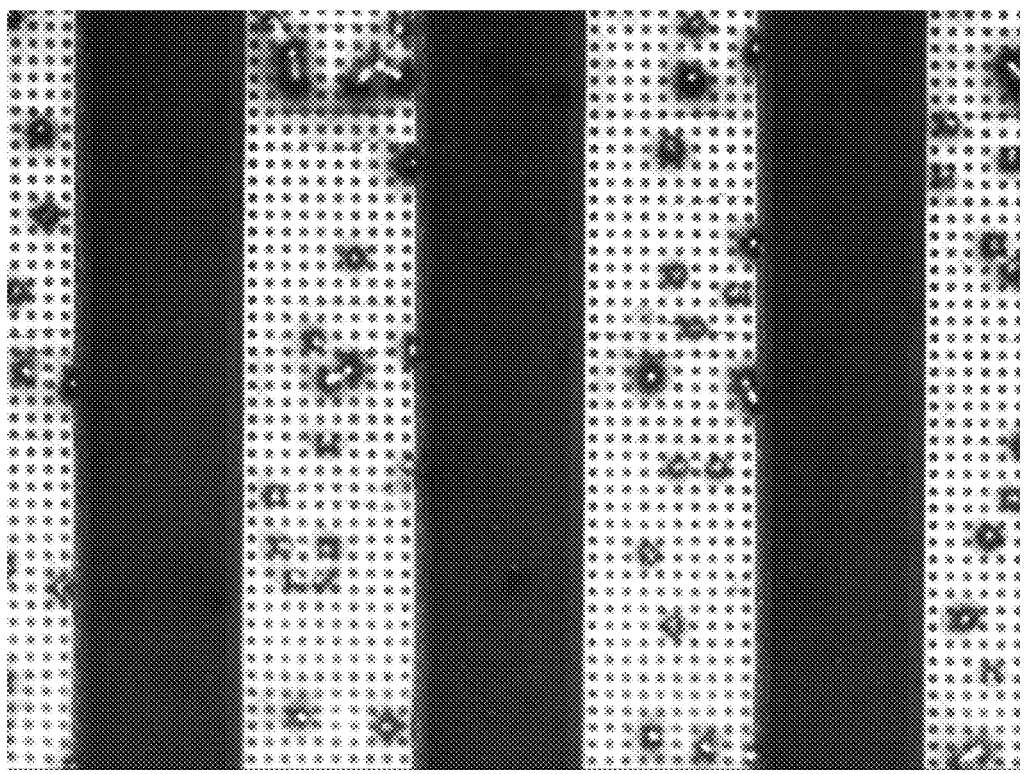
Figure 15:
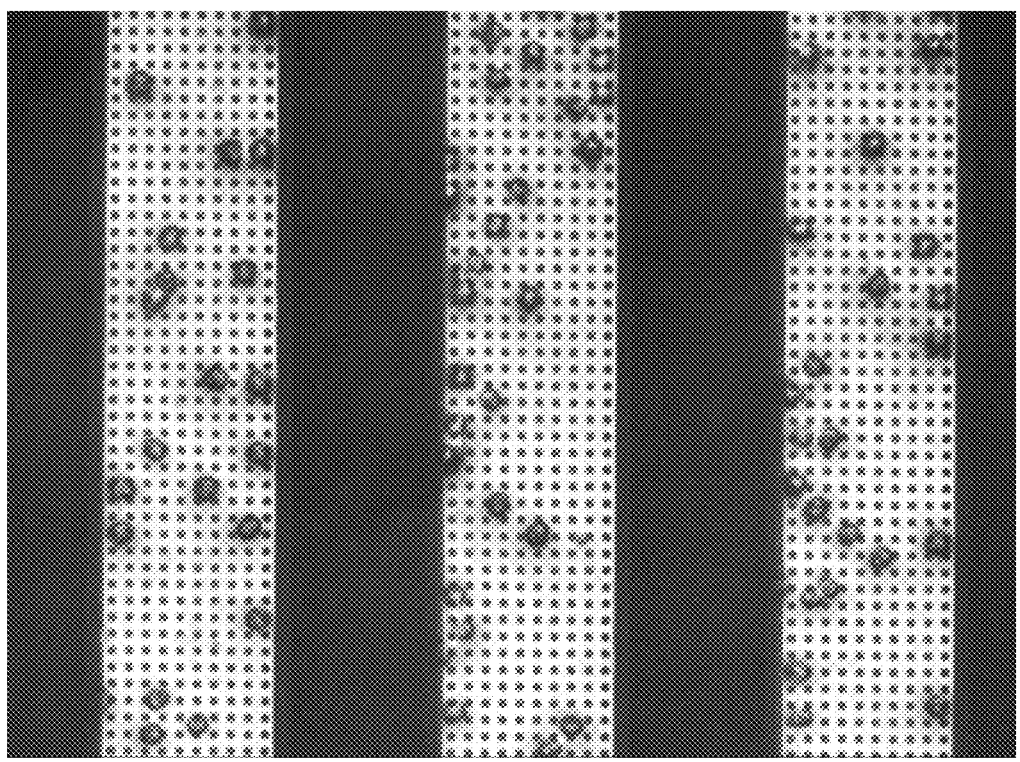
Figure 16:
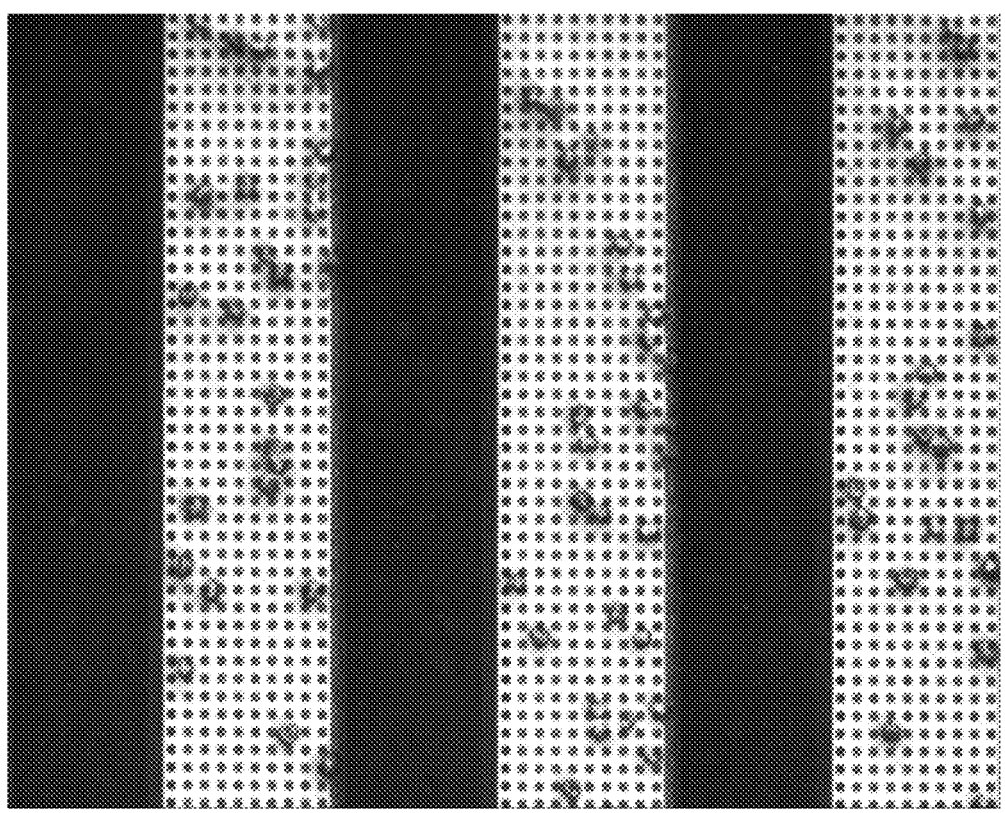

According to one embodiment of the present invention, as illustrated in FIG. 10, the electrode connection unit 50 may include a metallic core part 100, and a conductive nonmetallic coating layer 90a on a lower substrate 80.

The metallic core part 100 may include the above-described plurality of first holes formed therein, and may be formed as a single layer or in a plurality of layers.

The conductive nonmetallic coating layer 90a may or may not have the above-described plurality of first holes formed therein, and may be formed as a single layer, or as illustrated in FIG. 10, may be formed in a plurality of layers 90a and 90b.

When the conductive nonmetallic coating layer is formed as a single layer, the coating layer may be arranged on an upper side of the metallic core part 100 or a lower side of the metallic core part 100.

When using metal as the material of the electrode connection unit 50, since correction may occur therein, the electrode connection unit 50 may include the conductive nonmetallic coating layer. The conductive nonmetallic coating layer may be made of a material including at least one of the above-described conductive metal oxide, and conductive carbon.

As the conductive metal oxide, the above-described ITO, IZO, AZO and TCO may be used, but it is not particularly limited thereto. These materials may be used alone or in combination of two or more thereof.

As the conductive carbon, the above-described carbon nanowires, carbon nanotubes (CNT), graphene, etc., may be used, but it is not particularly limited thereto. These materials may be used alone or in combination of two or more thereof.

According to one embodiment of the present invention, as illustrated in FIG. 10, the electrode connection unit 50 may further include an insulation layer 110 on the lower substrate 80.

The insulation layer 110 may be formed in a single layer, or as illustrated in FIG. 10, may be formed in a plurality of layers 110a and 110b.

Since the electrode connection unit of the present invention further includes the insulation layer, a pressure applied to the electrode connection unit may be effectively diffused due to buffering action of the insulation layer, thus to reduce an occurrence of cracks in the electrode connection unit.

As illustrated in FIG. 10, the insulation layer 110 may cover at least a portion of the electrode connection unit 50.

When occurring cracks in the electrode connection unit 50, in particularly, cracks may more easily occur in an edge portion of the electrode connection unit 50 than the other portions. The insulation layer 110 may cover at least a portion of the electrode connection unit 50, such that the edge portion may be protected by the insulation layer 110 to reduce an occurrence of cracks.

The above "at least a portion" is not particularly limited so long as it may cover the edge portion of the electrode connection unit 50, but more specifically, may cover the edge portion by an area ratio satisfying the following Equation 1.

$$0.2 \leq A'/A \leq 0.98 \qquad \text{[Equation 1]}$$

In Equation 1, A is a total area of electrode connection unit, and A' is an area of a portion which is not covered with the insulation layer among the electrode connection unit.

Equation 1 shows a range of the area ratio of the portion which is not covered with the insulation layer among the electrode connection unit 50 relative to the electrode connection unit 50. When the area ratio thereof is within the range satisfying Equation 1, electrical connection of the electrode connection unit 50 may be effectively performed without a decrease in conductivity, and the edge portion thereof may be protected. Thereby, the pressure applied thereto from an outside may be diffused to significantly reduce an occurrence of cracks in the electrode connection unit 50.

In the present invention, if the area ratio of Equation 1 is less than 0.2, the conductive member may not sufficiently contact during adhering the same, and if the area ratio thereof exceeds 0.98, the electrode connection unit is not sufficiently protected, so that cracks may easily occur in the edge portion of the electrode connection unit when a bending stress is applied thereto.

For example, the area ratio of Equation 1 is in a range of 0.2 to 0.98, and more particularly, 0.3 to 0.95. The above-described effects may be more improved within the above range.

Figure 18A:
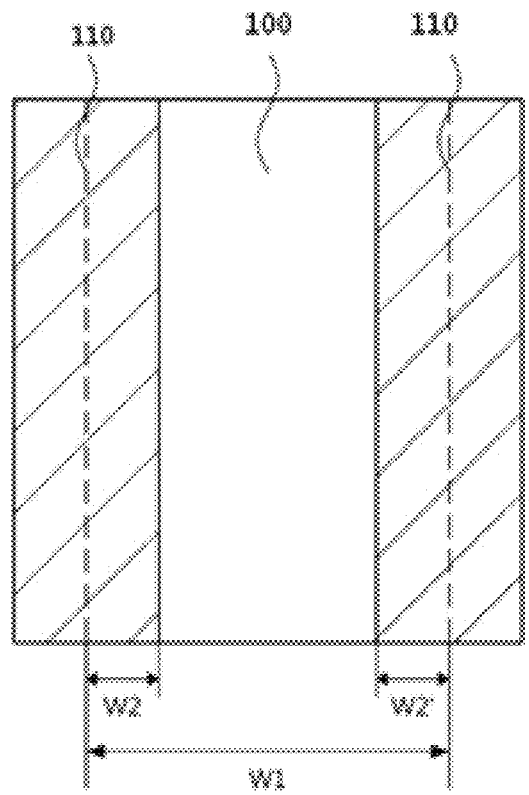
FIGS. 18A and 18B are schematic views illustrating an electrode connection unit according to another embodiment of the present invention.
Figure 18B:
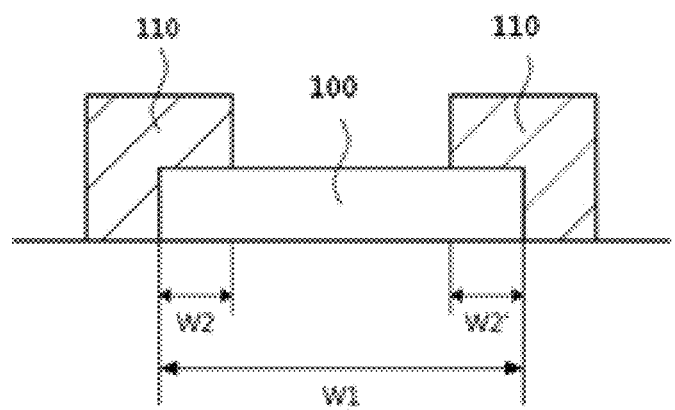

As illustrated in FIGS. 18A and 18B, the electrode connection unit 50 according to one embodiment of the present invention may be formed in a rectangular shape. In this case, the insulation layers 110 may be formed to face each other on the electrode connection unit 50, and may satisfy a dimensional relation with respect to the electrode connection unit represented by the following Equation 2.

$$W1-(W2+W2') \geq 30 \text{ μm} \qquad \text{[Equation 2]}$$

In Equation 2, W1 is a width (μm) of the electrode connection unit between facing ends of the insulation layer 110, which is in a range of 50 to 250 μm, W2 is a width (μm) of one insulation layer 110 that covers one end portion of the electrode connection unit in a width direction of W1, and W2' is a width (μm) of the other insulation layer 110 that covers the other end portion of the electrode connection unit in the width direction of W1.

Equation 2 shows the dimensional relation defined by parameters for the widths between portions of the metallic core part 100 of the electrode connection unit 50 covered with the insulation layers 110, and a portion thereof which is not covered with the insulation layer 110. When the dimensional relation between the electrode connection unit 50 and the insulation layers 110 satisfying the range of Equation 2, the electrical connection of the electrode connection unit 50 may be effectively performed without a decrease in conductivity, and the edge portion thereof may be protected. Thereby, it is possible to significantly reduce an occurrence of cracks in the electrode connection unit 50.

If the value of Equation 2 is less than 30 μm, when adhering anisotropic conductive film (ACF) conductive balls to the electrode connection unit 50, due to the ACF conductive balls are not sufficiently adhered thereto, a damage in electrical characteristics may occur. For example, the value of Equation 2 is 40 μm or more, and the above-described effects may be more improved within the above range.

In Equation 2, a sum of the widths W2 and W2' may be 2 μm or more. In this case, the above-described effects may be implemented, and the ACF conductive balls may be easily adhered to the electrode connection unit 50 regardless of an error range in positions that may occur when connecting the conductive member during the manufacturing process.

Figure 19:
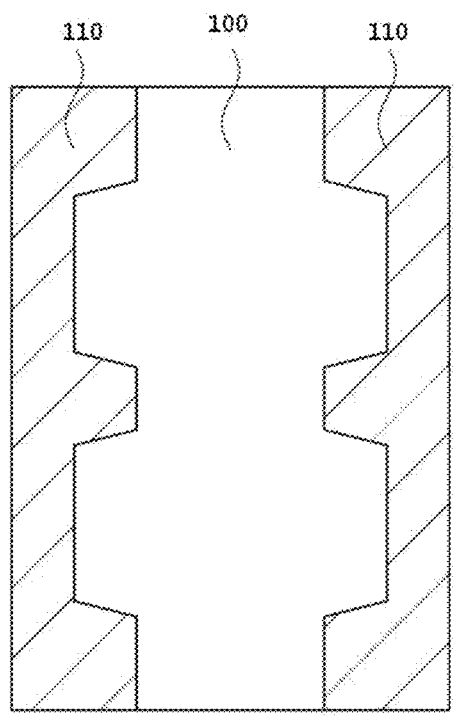
FIG. 19 is a schematic view illustrating an electrode connection unit according to another embodiment of the present invention.
Figure 20:
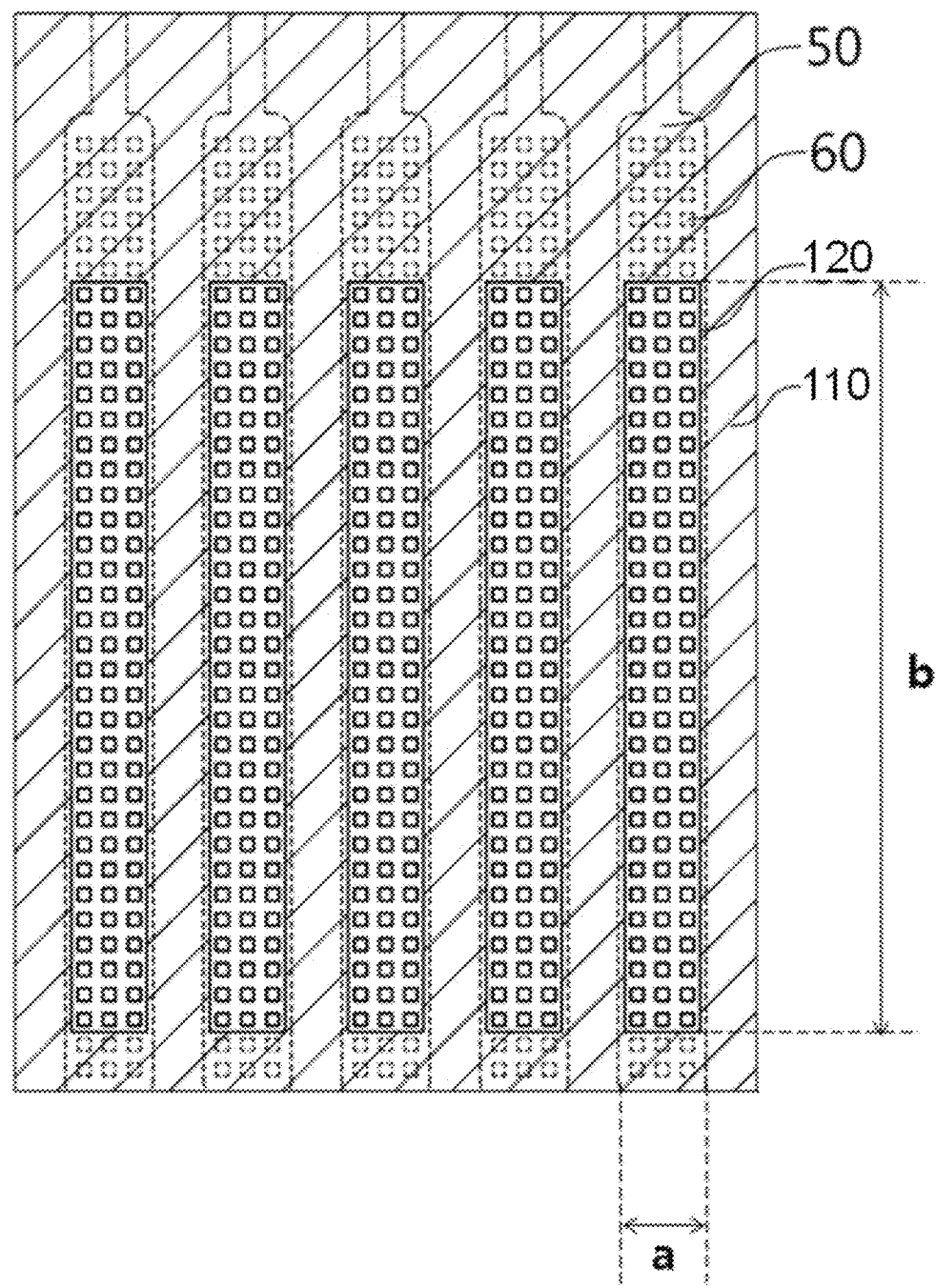
FIGS. 20 and 21 are views schematically illustrating an electrode connection unit according to another embodiment of the present invention, respectively.

According to another embodiment of the present invention, the insulation layer 110 may be formed as a predetermined pattern. Referring to FIG. 19, ends of the insulation layers 110 on the metallic core part 100 of the electrode connection unit 50 may be formed to have a predetermined pattern. The shape of the pattern is not particularly limited, but may be suitably selected according to the shape of conductive member to be connected, for example.

The electrode connection unit 50 of the present invention may include the metallic core part 100, and the conductive nonmetallic coating layer, and the insulation layers 110 according to the present invention may cover at least a portion of the metallic core part 100.

In addition, the insulation layers 110 according to the present invention may cover at least a portion of the conductive nonmetallic coating layer. The insulation layer 110 may cover the metallic core part 100 and the conductive nonmetallic coating layer in the above-described area range, but it is not limited thereto.

Since the insulation layers 110 cover at least a portion of the metallic core part 100 or at least a portion of the conductive nonmetallic coating layer, and at least a portion of the metallic core part 100 or at least a portion of the conductive nonmetallic coating layer is exposed, electrical connections between the electrode connection unit 50 and other conductive members may be achieved.

A material of the insulation layer may include any conventional material so long as it is commonly used in the related art without particular limitation thereof. For example, inorganic insulating materials such as silicon oxide, silicon nitride, etc., or organic insulating materials such as a photo-curable resin composition may be used.

According to one embodiment of the present invention, the insulation layer 110 may have a second hole 120.

The insulation layer 110 cover at least a portion of the metallic core part 100 or at least a portion of the conductive nonmetallic coating layer, and a portion of the metallic core part 100 or a portion of the conductive nonmetallic coating layer partially exposed may serve as the second hole 120, or alternately the second hole 120 may be individually formed.

A shape or size of the second hole 120 of the insulation layer 110 according to the present invention are not particularly limited so long as it may be electrically connected with the above other conductive members. One second hole 120 may be formed at a portion to be connected with other conductive members (for example, a portion to which the FPCB is adhered), or a plurality of second holes 120 may be formed at the portion to which the FPCB is adhered (see FIG. 21).

The shape of the second hole 120 may be suitably selected according to the shape of the portion to be connected with other conductive members, and may have a circular or polygonal shape, but it is not particularly limited thereto. The polygon may include for example, a triangle, quadrangle, hexagon, octagon, decagon, and the quadrangle may include a rectangle, rhombus, and the like.

In the present invention, a method of forming the second holes 120 in the insulation layer 110 is not particularly limited. For example, the second holes 120 may be formed at the portion to be connected with other conductive members by a method including processes of: depositing silicon oxide or silicon nitride to the insulation layer 110 in a predetermined pattern using a mask; after depositing throughout an entire surface thereof, patterning the same using dry etching; or after applying a photo-curable resin composition to the insulation layer 110 of the electrode connection unit 50, exposing and developing the same using the mask pattern.

Electric Device, Image Display Device, and Touch Screen Panel

In addition, the present invention provides an electric device including the above-described electrode connection unit 50.

In the present disclosure, the term of "electric device" means various electric or electronic products including the electrodes required for electrical connection, components included in the electronic products, or the like.

Further, the present invention provides an image display device including the electric device. As the image display device of the present invention, flat panel displays such as a liquid crystal display (LCD), field emission display (FED), plasma display panel (PDP), organic light emitting diode (OLED) may be effectively used.

Furthermore, the present invention provides a touch screen panel including the electronic device.

When applying the electrode connection unit 50 of the present invention to the touch screen panel, the lower substrate may use a film, glass, plastic material, and the like, without particular limitation thereof, and an upper insulation layer may use an organic insulating film, inorganic insulating film, optical clear adhesive (OCA) film, optical clear resin (OCR), and the like, without particular limitation thereof.

Further, touch patterns included in the touch screen panel may employ any pattern so long as it is commonly used in the related art without particular limitation thereof within a range not departing from the purpose of the present invention.

Hereinafter, exemplary embodiments will be described to more concretely understand the present invention with reference to examples. However, it will be apparent to those skilled in the art that such embodiments are provided for illustrative purposes and various modifications and alterations may be possible without departing from the scope and spirit of the present invention, and such modifications and alterations are duly included in the present invention as defined by the appended claims.

Example 1

A metallic core part was made of Ag, an ITO conductive nonmetallic coating layer was formed on an upper side of the metallic core part, and a plurality of first holes were formed therein, to manufacture an electrode connection unit in which the plurality of first holes are arranged in a total area of 23.4%, relative to a region of a portion connected with other conductive members on the electrode connection unit.

Example 2

An electrode connection unit was manufactured according to the same procedures as described in Example 1, except that an ITO conductive nonmetallic coating layer was formed on a lower side of the metallic core part instead of the upper side thereof.

Example 3

An electrode connection unit was manufactured according to the same procedures as described in Example 2, except that an ITO conductive nonmetallic coating layer was further formed on the upper side of the metallic core part.

Example 4

An electrode connection unit was manufactured according to the same procedures as described in Example 3, except that, before forming the ITO conductive nonmetallic coating layer on the upper side of the metallic core part in Example 3, an acrylic insulation layer was formed on the metallic core part in the shape of FIGS. 18A, 18B and 19.

Example 5

As illustrated in FIG. 10, a metallic core part 100 was formed of Ag, ITO conductive nonmetallic coating layers 90a and 90b were formed on upper/lower sides of the metallic core part 100, two acrylic insulation layers 110a and 110b were formed thereon, and a plurality of first holes were formed therein, to manufacture an electrode connection unit in which the plurality of first holes are arranged in a total area of 23.4%, relative to a region of a portion connected with other conductive members on the electrode connection unit.

Examples 6 to 9

Electrode connection units were manufactured according to the same procedures as described in Example 5, except that the first holes thereof were formed to have areas as shown in Table 1 below.

Comparative Example 1

An electrode connection unit was manufactured according to the same procedures as described in Example 1, except that a plurality of first holes were arranged in a total area of 5.7%, relative to a region of a portion connected with other conductive members on the electrode connection unit, and the ITO conductive nonmetallic coating layer was not formed.

Comparative Example 2

An electrode connection unit was manufactured according to the same procedures as described in Example 1, except that the hole was not formed.

TABLE 1

| Section | With (○) or without (X) a plurality of first holes | Total area of plurality of first holes (%) |
|---|---|---|
| Example 1 | ○ | 23.4 |
| Example 2 | ○ | 23.4 |
| Example 3 | ○ | 23.4 |
| Example 4 | ○ | 23.4 |
| Example 5 | ○ | 23.4 |
| Example 6 | ○ | 11.7 |
| Example 7 | ○ | 5.7 |
| Example 8 | ○ | 34.6 |
| Example 9 | ○ | 36.7 |
| Comparative Example 1 | ○ | 5.7 |
| Comparative Example 2 | X | 0 |

Experimental Example (1) Evaluation for Occurrence of Cracks

Evaluation of an occurrence of cracks was executed under conditions described in Table 2 below using the electrode connection units manufactured in the examples and comparative examples. The number of cracks that occurred in the metallic core part and in the nonmetallic coating layer was summed up, and results thereof are listed in Table 2 below.

TABLE 2

| | Condition of evaluation for occurrence of cracks | | |
|---|---|---|---|
| Section | Load (Kgf) | Temperature (° C.) | Time (sec) |
| Example 1 | 6 | 155 | 10 |
| Example 2 | 6 | 155 | 10 |
| Example 3 | 6 | 155 | 10 |
| Example 4 | 6 | 155 | 10 |
| Example 5 | 6 | 155 | 10 |
| Example 6 | 6 | 155 | 10 |
| Example 7 | 6 | 155 | 10 |
| Example 8 | 6 | 155 | 10 |
| Example 9 | 6 | 155 | 10 |
| Comparative Example 1 | 6 | 155 | 10 |
| Comparative Example 2 | 6 | 155 | 10 |

(2) Evaluation for Electrical Conductivity

In order to evaluate the electrical conductivity of the electrode connection unit manufactured in the examples and comparative examples, contact ratios were calculated using an area of the electrode connection unit in which metals and conductive balls can contact with each other, that is, an area of the metallic core part in which the metals are remained. In addition, in cases of Examples 5 to 9 having the insulation layers on the upper side of the electrode connection unit, the contact ratios were calculated using an area in which metals and conductive balls can substantially contact with each other. A high contact ratio means a high electrical conductivity, that is, as the contact ratio is increased, the electrical conductivity is also increased. The electrical conductivity was determined based on the calculated contact ratio, and results thereof are listed in Table 3 below.

TABLE 3

| | Evaluation for occurrence of cracks | | | |
|---|---|---|---|---|
| Section | Number of occurrence of cracks/ Number of evaluations | Average number of cracks | Contact ratio (%) (Electrical conductivity) | Total area of plurality of first holes (%) |
| Example 1 | 2/10 | 3 | 77 | 23.4 |
| Example 2 | 2/10 | 4 | 77 | 23.4 |
| Example 3 | 1/10 | 3 | 77 | 23.4 |
| Example 4 | 1/10 | 2 | 77 | 23.4 |
| Example 5 | 1/10 | 1 | 69 | 23.4 |
| Example 6 | 0/10 | 0 | 79 | 11.7 |
| Example 7 | 0/10 | 0 | 85 | 5.7 |
| Example 8 | 1/10 | 2 | 59 | 34.6 |
| Example 9 | 5/10 | 58 | 57 | 36.7 |
| Comparative Example 1 | 8/10 | 21 | 94 | 5.7 |
| Comparative Example 2 | 10/10 | Cut | 100 | 0 |

Figure 17:
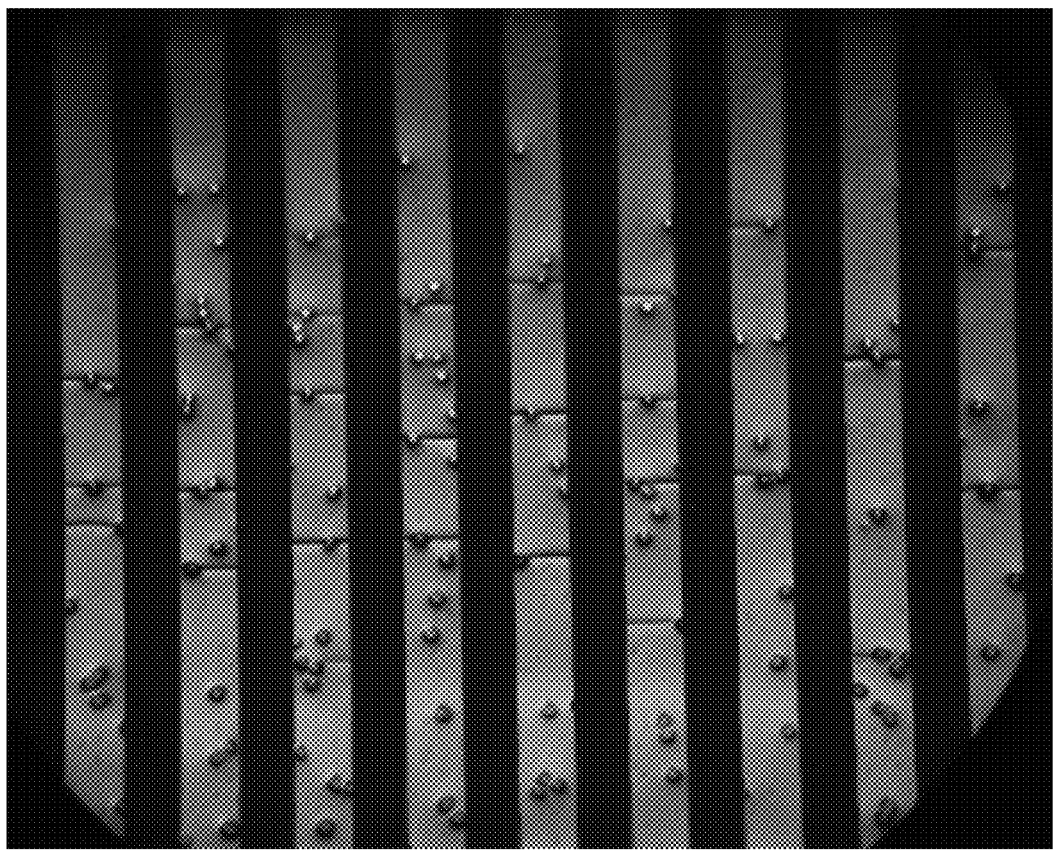
FIG. 17 is an image illustrating an electrode connection unit of Comparative Example 2 after evaluation for an occurrence of cracks.

FIGS. 11 to 16 are images illustrating the electrode connection units of Examples 1 to 6 after evaluation for an occurrence of cracks, respectively, and FIG. 17 is an image illustrating an electrode connection unit of Comparative Example 2 after evaluation for an occurrence of cracks.

Referring to the above Table 3 and FIGS. 10 to 16, it could be seen that the electrode connection units of the examples including a plurality of holes according to the present invention exhibited no occurrence of cracks or significantly reduced number of occurrence of cracks compared to the electrode connection units of the comparative examples which do not include a plurality of holes, such that even if a pressure is applied to the electrode connection unit of the present invention, the pressure may be diffused to prevent an occurrence or diffusion of cracks.

Example 10

Figure 21:
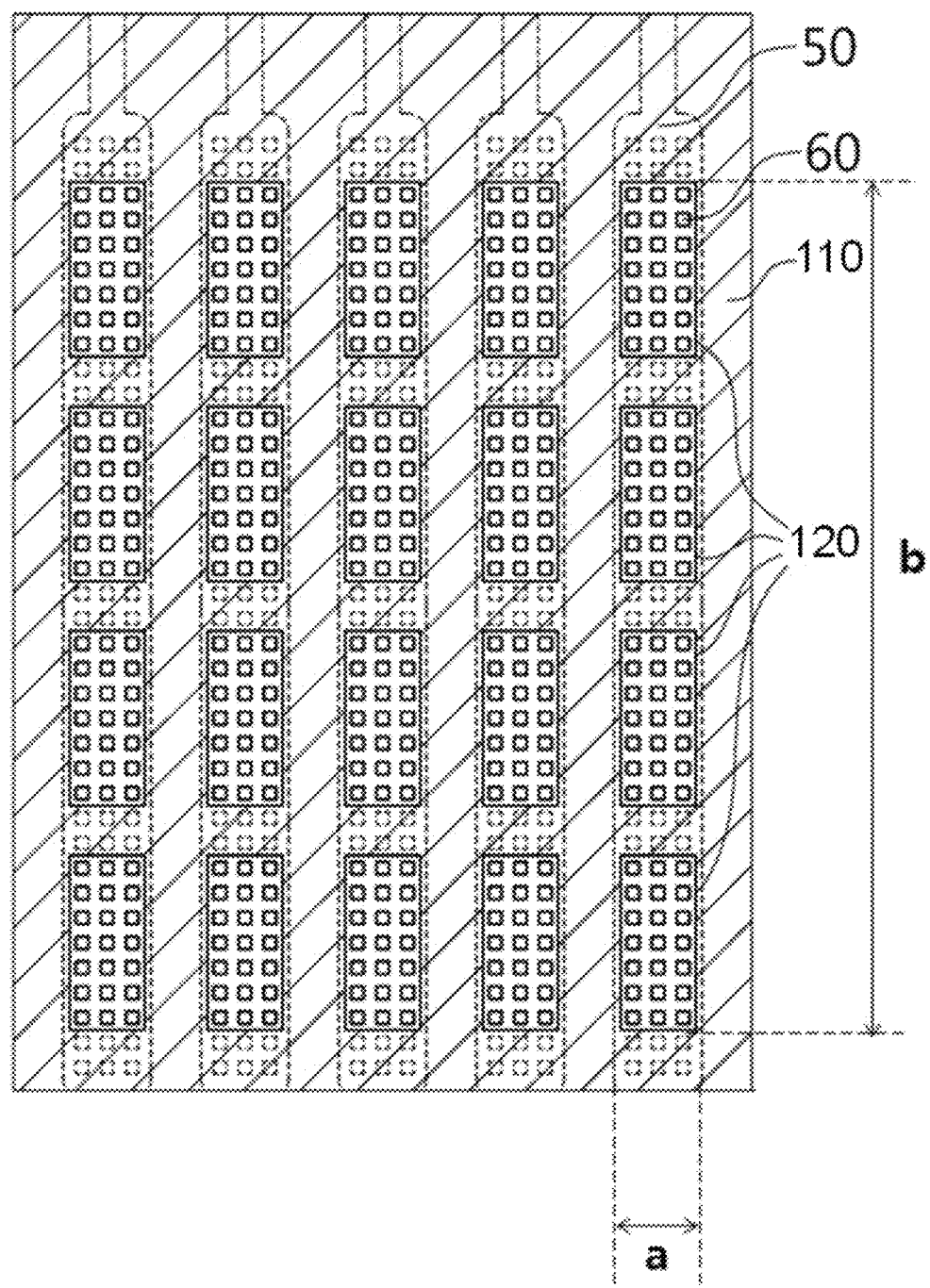

As illustrated in FIGS. 10 and 21, a plurality of first holes were formed in a metallic core part made of Ag so that a total area thereof becomes 23.4%, and ITO conductive coating layers were formed on upper/lower sides of the metallic core part, thereby manufacturing an electrode connection unit including an acrylic insulation layer, in which a total of four second holes are formed at a portion to which the FPCB is adhered, on the upper side of the coating layer.

In this case, the total area of the plurality of first holes was calculated based on the region of a portion connected with other conductive members on the electrode connection unit.

Examples 11 and 12, and Comparative Examples 3 and 4

Electrode connection units were manufactured according to the same procedures as described in Example 1, except that insulation layers and metallic core parts are formed in structures as described in Table 4 below.

TABLE 4

| Section | Total area of first holes in metallic core part (%) | Number of second holes in insulation layer |
|---|---|---|
| Comparative Example 3 | 0 | Without insulation layer |
| Comparative Example 4 | 0 | 4 |
| Example 10 | 23.4 | 4 |
| Example 11 | 11.7 | 4 |
| Example 12 | 11.7 | 1 |

Test Procedure

1. Evaluation for Occurrence of Cracks

Evaluation for an occurrence of cracks were executed under conditions described in Table 5 below using the electrode connection units of the examples and comparative examples, and results thereof are illustrated in Table 5 below and FIG. 22.

2. Evaluation for Adhesive Force 11 horizontal lines and 11 vertical lines were drawn by an interval of 1 mm on surfaces of the electrode connection units prepared according to the examples and comparative examples opposite to the surfaces on which the insulation layers are formed, thereby preparing 100 lattice type cells having horizontal and vertical sizes of 1 mm, respectively. Peeling-off tests were executed in such a manner that a 3M #610 tape was adhered to the prepared cells, then the tape was strongly peeled-off in a vertical direction, and the 3M #610 tape was again adhered to the prepared cells, then the tape was also strongly peeled-off in the vertical direction, and thereafter the number of remained cells was counted, and results thereof are listed in Table 5 below.

3. Evaluation for Peel Adhesion

FPCBs were adhered to the electrode connection units manufactured according to Example 11 and Comparative Example 3 at 155° C. by a pressure of 7 kgf, then the FPCBs were peeled-off therefrom to measure peel adhesion.

The peel adhesion is a value obtained by dividing a vale measured in a peel adhesion meter by a length of the adhered FPCB, and an FPCB having a length of 1 cm was used in the present test.

Ten electrode connection units which are the same as those of Example 11 and Comparative Example 3 were manufactured, respectively, and peel adhesion was measured. Results thereof are listed in Table 6 below.

TABLE 5

| Section | Condition of evaluation for occurrence of cracks | | | Evaluation for occurrence of cracks | | Adhesive force (Number of remained cells) |
|---|---|---|---|---|---|---|
| | Load (Kgf) | Temperature (° C.) | Time (sec) | Number of occurrence of cracks/Number of evaluations | Number of occurrence of cracks/Number of evaluations | |
| Comparative Example 3 | 6.4 | 155 | 10 | 10/10 | 177 | 38 |
| | 10 | 155 | 10 | 10/10 | 235 | |
| Comparative Example 4 | 6.4 | 155 | 10 | 10/10 | 43 | 100 |
| | 10 | 155 | 10 | 10/10 | 57 | |
| Example 10 | 6.4 | 155 | 10 | 1/10 | 1 | 100 |
| | 10 | 155 | 10 | 8/10 | 50 | |
| Example 11 | 6.4 | 155 | 10 | 0/10 | — | 100 |
| | 10 | 155 | 10 | 7/10 | 38 | |
| Example 12 | 6.4 | 155 | 10 | 0/10 | — | 100 |
| | 10 | 155 | 10 | 5/10 | 18 | |

Figure 22:
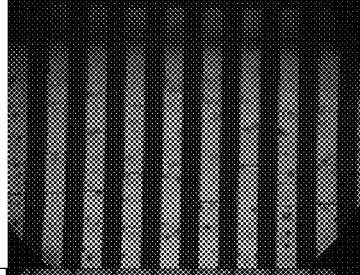
FIG. 22 shows images illustrating results of evaluation for an occurrence of cracks in the electrode connection units of the examples and comparative examples.
Figure 22:
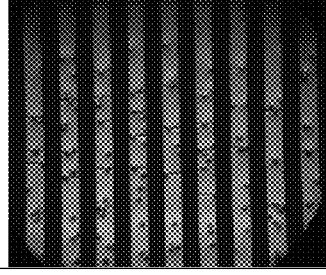
Figure 22:
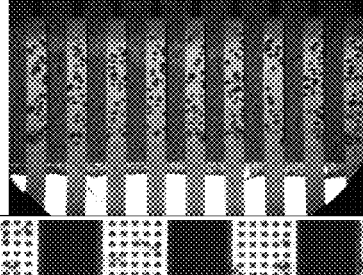
Figure 22:
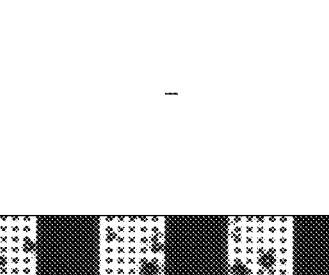
Figure 22:
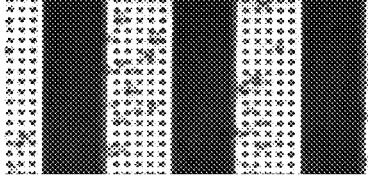
Figure 22:
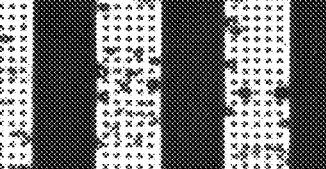
Figure 22:
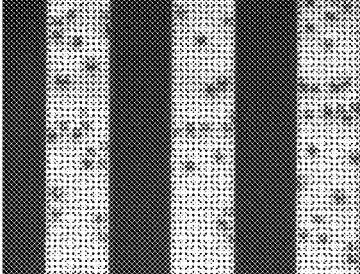
Figure 22:
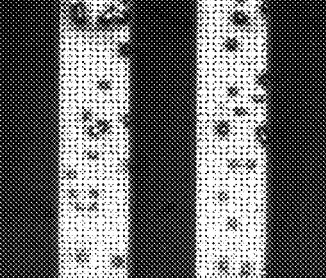
Figure 22:
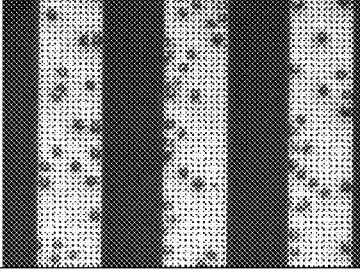

FIG. 22 shows images illustrating the electrode connection units of Examples 10 to 12 and Comparative Examples 3 and 4 after evaluating an occurrence of cracks under 6.4 and 10 kgf conditions.

Referring to the above Table 5 and FIG. 22, it could be seen that the electrode connection units of the examples including predetermined holes according to the present invention exhibited no occurrence of cracks or significantly reduced number of occurrence of cracks compared to the electrode connection units of the comparative examples which did not include a plurality of holes, such that even if a pressure is applied to the electrode connection unit of the present invention, the pressure may be diffused to prevent an occurrence or diffusion of cracks. Further, it also could be seen that, in a case of the electrode connection unit according to Comparative Example 3 which did not include the insulation layer, the adhesive force of the electrode connection unit was significantly decreased.

Meanwhile, it could be seen that, in a case of the electrode connection unit according to Comparative Example 4 which included the insulation layers but did not include a plurality of first holes therein, the same level of adhesive force as that of the examples was implemented, however larger number of the cracks occurred than the examples.

TABLE 6

| Section (g/cm) | Comparative Example 3 | Example11 |
| --- | --- | --- |
| Sample 1 | 800 | 1238 |
| Sample 2 | 820 | 1250 |
| Sample 3 | 780 | 1127 |
| Sample 4 | 860 | 1320 |
| Sample 5 | 780 | 1251 |
| Sample 6 | 880 | 1217 |
| Sample 7 | 820 | 1232 |
| Sample 8 | 880 | 1311 |
| Sample 9 | 780 | 1272 |
| Sample 10 | 1,060 | 1280 |
| Mean value | 846 | 1,250 |
| Maximum value | 1,060 | 1,320 |
| Minimum value | 780 | 1,127 |
| Maximum and minimum deviation | 280 | 193 |

Referring to the above Table 6, it could be seen that the electrode connection unit of Comparative Example 3 which did not include the hole and insulation layer exhibited significantly reduced peel adhesion compared to Example 11 after adhering the FPCB. This means that each layer has a low adhesion force, and thereby, it could be seen that, when the electrode connection unit of Comparative Example 1 is applied to a product and placed in a pressured condition, each layer of the electrode connection unit may be easily separated, and thus cracks may easily occur.

What is claimed is:

1. An electrode connection unit to be electrically connected with electrode terminals, the electrode connection unit comprising:
    a substrate;
    a metallic core part including a plurality of first holes penetrating from a top surface of the metallic core part to a bottom surface of the metallic core part; and
    a first conductive nonmetallic coating layer between the substrate and the metallic core part, wherein the first conductive nonmetallic coating layer does not include holes therein, and the first conductive nonmetallic coating layer and the metallic core part directly contact each other.

2. The electrode connection unit according to claim 1, wherein the plurality of first holes are arranged on straight lines connecting between one end and the other end of the electrode connection unit.

3. The electrode connection unit according to claim 2, wherein the plurality of first holes are regularly or irregularly arranged so that any straight line connecting between one end and the other end of the electrode connection unit meets with at least one of the first holes.

4. The electrode connection unit according to claim 1, wherein a total area of the plurality of first holes is 1 to 90%, based on an area of a portion connected with other conductive members on the electrode connection unit.

5. The electrode connection unit according to claim 1, wherein a total area of the plurality of first holes is 5 to 35%, based on an area of a portion connected with other conductive members on the electrode connection unit based on the region.

6. The electrode connection unit according to claim 1, wherein the metallic core part is formed in a plurality of layers.

7. The electrode connection unit according to claim 1, further comprising a second conductive nonmetallic coating layer on the metallic core part,
    wherein the metallic core part is interposed between the first conductive nonmetallic coating layer and the second conductive nonmetallic coating layer.

8. The electrode connection unit according to claim 1, further comprising an insulation layer which covers at least a portion of the metallic core part.

9. The electrode connection unit according to claim 8, wherein the insulation layer includes a second hole therein.

10. The electrode connection unit according to claim 9, wherein a plurality of second holes are formed in the insulation layer.

11. The electrode connection unit according to claim 7, further comprising an insulation layer which covers at least a portion of the second conductive nonmetallic coating layer.

12. The electrode connection unit according to claim 11, wherein the insulation layer includes a second hole formed therein.

13. The electrode connection unit according to claim 12, wherein a plurality of second holes are formed in the insulation layer.

14. An electric device comprising the electrode connection unit according to claim 1 electrically connected with the electrode terminals.

15. An image display device comprising the electric device according to claim 14.

16. A touch screen panel comprising the electric device according to claim 14.

* * * * *